United States Patent
Na

(10) Patent No.: US 9,147,452 B2
(45) Date of Patent: Sep. 29, 2015

(54) SYNCHRONOUS SEMICONDUCTOR MEMORY DEVICE HAVING DUAL DELAY LOCKED LOOP CIRCUIT AND METHOD OF MANAGING DUAL DELAY LOCKED LOOP CIRCUIT

(71) Applicant: SAMSUNG ELECTRONICS CO., LTD., Suwon-si, Gyeonggi-do (KR)

(72) Inventor: Taesik Na, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 14 days.

(21) Appl. No.: 14/208,993

(22) Filed: Mar. 13, 2014

(65) Prior Publication Data

US 2014/0269120 A1 Sep. 18, 2014

(30) Foreign Application Priority Data

Mar. 15, 2013 (KR) ........................ 10-2013-0028058

(51) Int. Cl.
| | |
|---|---|
| G11C 7/00 | (2006.01) |
| G11C 7/22 | (2006.01) |
| G11C 7/02 | (2006.01) |
| G11C 7/10 | (2006.01) |
| G11C 11/4076 | (2006.01) |
| G11C 11/4093 | (2006.01) |
| H03L 7/081 | (2006.01) |

(52) U.S. Cl.
CPC ........ *G11C 7/222* (2013.01); *G11C 7/02* (2013.01); *G11C 7/106* (2013.01); *G11C 7/1066* (2013.01); *G11C 11/4076* (2013.01); *G11C 11/4093* (2013.01); *H03L 7/0814* (2013.01); *G11C 2207/2272* (2013.01)

(58) Field of Classification Search
CPC ...... H03L 7/0814; G11C 7/222; G11C 7/106; G11C 11/4076; G11C 2207/2272
USPC ........ 365/194, 233.1, 226, 193; 327/158, 161
See application file for complete search history.

(56) References Cited

U.S. PATENT DOCUMENTS

| | | |
|---|---|---|
| 6,492,852 B2 | 12/2002 | Fiscus |
| 6,642,760 B1 | 11/2003 | Alon et al. |
| 6,859,413 B2 | 2/2005 | Phan et al. |
| 7,259,604 B2 | 8/2007 | Gomm |
| 7,583,115 B2 | 9/2009 | Gomm et al. |
| 7,786,752 B2 | 8/2010 | Oh et al. |
| 7,881,149 B2 | 2/2011 | Johnson et al. |
| 8,134,886 B2 * | 3/2012 | Ma .............................. 365/233.1 |

* cited by examiner

*Primary Examiner* — David Lam
(74) *Attorney, Agent, or Firm* — Lee & Morse, P.C.

(57) ABSTRACT

A synchronous semiconductor memory device includes a first delay locked loop circuit and a second delay locked loop circuit. The first delay locked loop circuit has a first delay line and generates a first clock hat is delay-synchronized with a clock applied as a signal for a data output timing control. The second delay locked loop circuit has a second delay line and generates a second clock that is delay-synchronized with the clock. The first delay locked loop circuit consumes less power than the second delay locked loop circuit, and the second delay locked loop circuit has less jitter than the first delay locked loop circuit. The first and second delay locked loop circuits operate at different logic levels for a delay synchronization operation.

20 Claims, 11 Drawing Sheets

SYNCHRONOUS SEMICONDUCTOR MEMORY DEVICE HAVING DUAL DELAY LOCKED LOOP CIRCUIT AND METHOD OF MANAGING DUAL DELAY LOCKED LOOP CIRCUIT

CROSS-REFERENCE TO RELATED APPLICATION

Korean Patent Application No. 10-2013-0028058, filed on Mar. 15, 2013, and entitled, "Synchronous Semiconductor Memory Device Having Dual Delay Locked Loop Circuit and Method of Managing Dual Delay Locked Loop Circuit," is incorporated by reference herein in its entirety.

BACKGROUND

1. Field

One or more embodiments herein relate to semiconductor memory devices.

2. Description of the Related Art

Some semiconductor memory devices have used a clock signal as a reference signal to synchronize operational timing. When an external clock signal is used, a time delay (e.g., clock skew) may occur. Various options have been considered in an attempt to control the time delay, in order to make an internal clock signal of the semiconductor memory device have the same phase as the external clock signal.

Especially, in the case of a double data rate synchronous dynamic random access memory (DDR SDRAM), synchronous operation of the clock may be of interest when applying a read latency operation and an on-die termination (ODT) technology. Consequently, a timing control circuit may be built into the DDR SDRAM for this purpose.

As the operational speeds of synchronous semiconductor memory devices increase, use of a delay locked loop (DLL) circuit having a robust jitter characteristic may serve as one option for timing control. However, in many cases, DLL circuits have been shown to consume too much power, which may adversely affect the overall performance of the semiconductor device.

SUMMARY

In accordance with one embodiment, a synchronous semiconductor memory device includes a first delay locked loop circuit having a first delay line, the first delay locked loop circuit to generate a first clock delay-synchronized with a clock applied as a signal for a data output timing control; and a second delay locked loop circuit having a second delay line, the second delay locked loop circuit to generate a second clock delay-synchronized with the clock, wherein the first delay locked loop circuit consumes less power than the second delay locked loop circuit, and wherein the second delay locked loop circuit has less jitter than the first delay locked loop circuit.

Also, the first and second delay locked loop circuits may operate at different logic levels for a delay synchronization operation. The first delay locked loop circuit may swing the clock to a CMOS level, and the second delay locked loop circuit may swing the clock to current mode logic (CML) level.

Also, the first clock may control read latency and the second clock may generate a data output strobe signal.

Also, the first delay line and the second delay line may have different amounts of delay. The amount jitter in the output signal of at least one of the first or second delay locked loop circuits may be affected by power noise. The synchronous semiconductor memory device may be a SDRAM. The SDRAM may have an operation range and an operation voltage that corresponds to DDR4.

In accordance with another embodiment, a method of operating a delay locked loop circuit of a synchronous semiconductor memory device includes generating a first clock delay-synchronized with a first input clock, the first clock generated by a first delay locked loop circuit having a first delay line; controlling data output timing control based on the first clock; generating a second clock delay-synchronized with a second input clock, the second clock generated by a second delay locked loop circuit having a second delay line; and generating a data output enable signal based on the second clock, wherein the second delay locked loop circuit has less jitter than the first delay locked loop circuit and wherein the data output enable signal is applied to change a clock domain.

Also, the first and second delay locked loop circuits may operate at different logic levels for a delay synchronization operation. The first input clock may be phase-split. The second input clock may have substantially a same phase as the first input clock. The second input clock may have a phase different from a phase of the first input clock.

Also, the first delay locked loop circuit may consume less power than the second delay locked loop circuit. The method may further include controlling read latency based on the first clock; and generating a data output strobe signal based on the second clock.

In accordance with another embodiment, a control circuit includes a first delay locked loop circuit to swing a clock signal to current mode logic level to generate a first clock delay-synchronized with the clock signal; and a second delay locked loop circuit to swing the clock signal to a CMOS logic level to generate a second clock delay-synchronized with the clock signal, wherein the first delay locked loop circuit consumes less power than the second delay locked loop circuit, and wherein the second delay locked loop circuit has less jitter than the first delay locked loop circuit.

Also, the first and second delay locked loop circuits may produce different amounts of delay. Also, the first clock may control read latency; and the second clock may generate a data output strobe signal.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
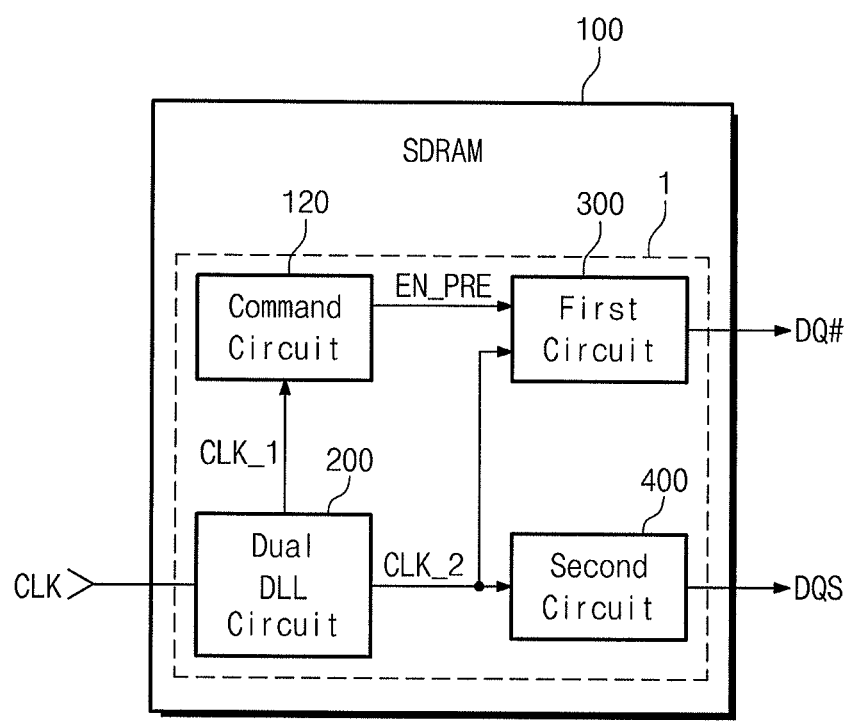
FIG. 1 illustrates a synchronous semiconductor memory device having an embodiment of a control circuit.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a control circuit 1 for a synchronous semiconductor memory device 100. Referring to FIG. 1, the control circuit 1 includes a command circuit 120, a dual DLL circuit 200, a first circuit 300, and a second circuit 400. The first circuit 300 may include an output driver for outputting data DQ#. The second circuit 400 may include an output driver for outputting a data output strobe signal DQS. The command circuit 120 decodes a command being applied and controls a read latency such as a CAS latency. The memory device 100 may be an SDRAM or another type of memory device.

The dual DLL circuit 200 generates first and second clocks CLK_1 and CLK_2 synchronized with respective input clocks CLK being applied. A first DLL circuit generating the first clock CLK_1 may have an inferior jitter characteristic, but may consume a relatively small amount of power. A second DLL circuit generating the second clock CLK_2 may consume a large amount of power, but may have a superior jitter characteristic compared to the first DLL circuit.

The first clock CLK_1 is used as a signal for a data output timing control. For example, the first clock CLK_1 can be used to control a read latency.

The second clock CLK_2 is used as a clock signal generating a data output enable signal for a change to a jitter-free clock domain. For example, the second clock CLK_2 can be used to generate a data output strobe signal.

In this embodiment, in which the dual DLL circuit 200 is applied to a synchronous semiconductor memory device, power consumed in the dual DLL circuit is comparatively small while a jitter characteristic of the dual DLL circuit is robust. The clock signal CLK is shown to be an external clock. While the control circuit 1 is shown as being included in synchronous memory device 100, the control circuit may be coupled to the synchronous memory device 100 in other embodiments.

Figure 2:
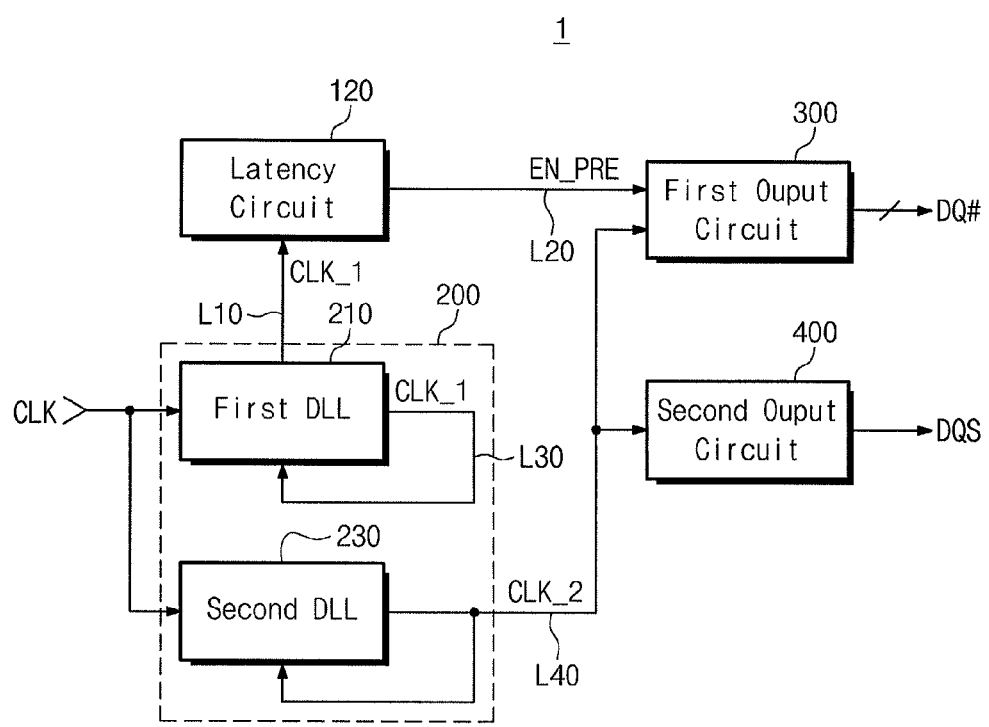
FIG. 2 illustrates another embodiment of the control circuit.

FIG. 2 illustrates another embodiment of a control circuit of a synchronous semiconductor memory device, which may be a specific application of the control circuit 1 of the memory device of FIG. 1. Referring to FIG. 2, the control circuit includes a latency circuit 120n as the command circuit and a dual DLL circuit 200 which includes a first DLL 210 and a second DLL 230. Also, a first output circuit 300 may correspond to the first circuit and a second output circuit 400 may correspond to the second circuit in FIG. 1.

The latency circuit 120 is connected to the first DLL 210 through a signal line L10. The quantity of delay is controlled in response to the first clock CLK_1. The latency circuit 120 is synchronized with the first clock CLK_1 to output an enable free signal EN_PRE through a signal line L20. As indicated, the latency circuit 120 may correspond to the command circuit of FIG. 1.

The first DLL 210 has a first delay line and generates the first clock CLK_1 that is delay-synchronized with a clock CLK being applied as a signal for data output timing control. The first clock CLK_1 feeds back through a feedback signal line L30.

The second DLL 230 has a second delay line and generates the second clock CLK_2 delay-synchronized with the clock CLK. The second clock CLK_2 is output through an output line L40 and feeds back to a phase detector in the second DLL 230.

Logic levels related to a synchronous delay operation of the first and second DLLs 210 and 230 may be different from each other. Thus, the first DLL 210 may consumes a small amount of power as compared with the second DLL 230, and the second DLL 230 may have a superior jitter characteristic as compared with the first DLL 210.

The first clock CLK 1 can be used to control read latency. Since the second clock CLK_2 has a relatively good jitter characteristic, it can be used to generate a data output strobe signal.

To increase immunity to noise, the second DLL 230 may receive the clock CLK to swing it to a current mode logic (CML) level. To reduce power consumption, the first DLL 210 may receive the clock CLK to swing it to a CMOS level. In one embodiment, the CMOS level may be greater than the CML level. Thus, since the CML level is relatively less affected by a power noise, the second DLL 230 has a relatively superior characteristic. Also, the first DLL 210 having a swing operation of the CMOS level consumes a small amount of power as compared with the second DLL 230 having a swing operation of the CML level.

In FIG. 2, since the first output circuit 300 can include an output driver for outputting data DQ#, it can correspond to the first circuit 300 of FIG. 1. The second output circuit 400 can include an output driver for outputting an output strobe signal DQS, it can correspond to the second circuit 400 of FIG. 1. Further, as illustrated in FIG. 2, because a heterogeneous dual DLL circuit is used to control latency, relatively less power is consumed while a superior jitter characteristic may be realized.

Figure 3:
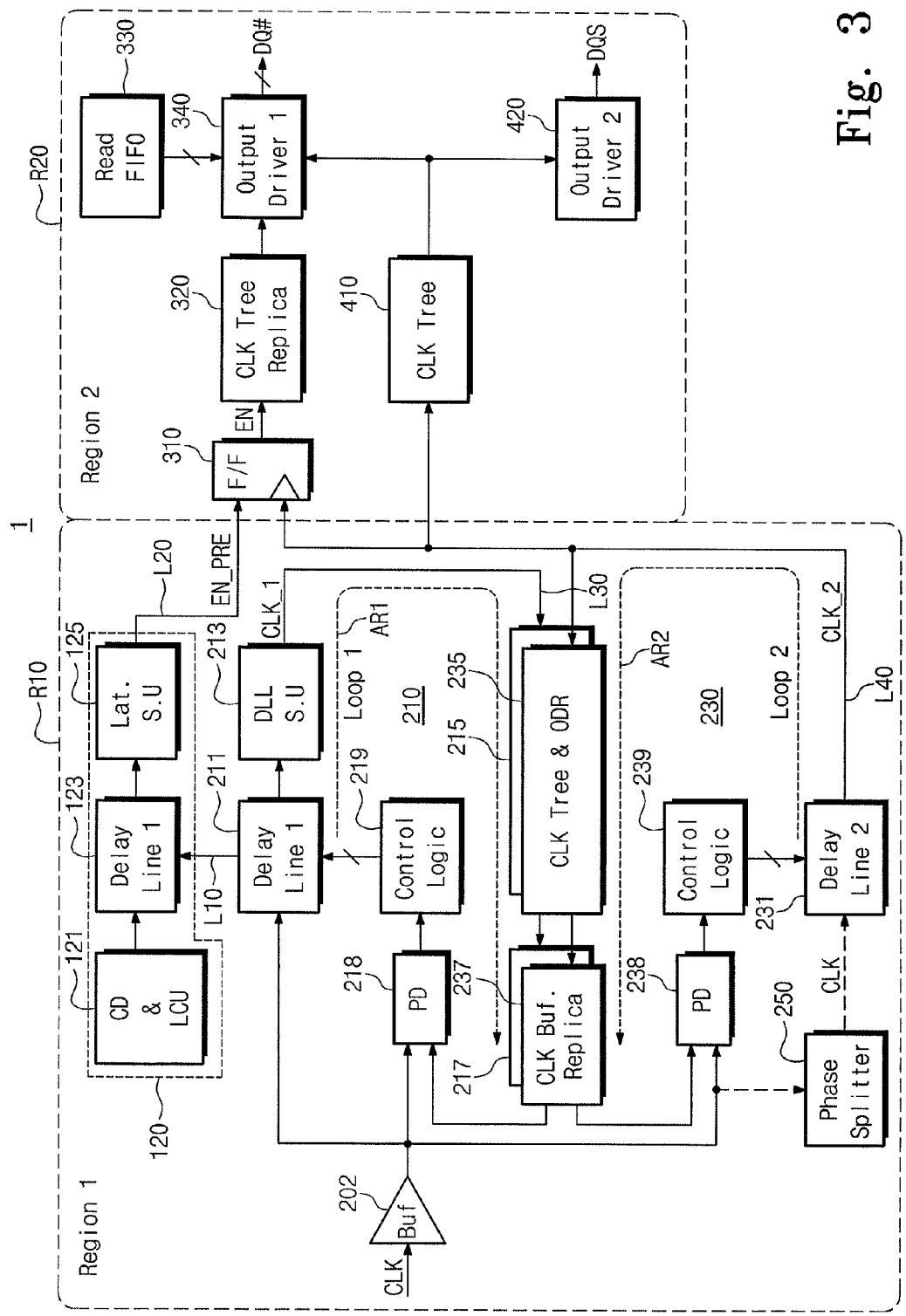
FIG. 3 illustrates another embodiment of the control circuit.

FIG. 3 illustrates another embodiment of a control circuit for a synchronous memory device. This control circuit may be even a more specific view of the control circuit 1 in FIG. 2. Referring to FIG. 3, the control circuit 1 is divided into a first region R10 and a second region R20. The first region R10 includes the latency circuit 120, the first DLL 210, and the second DLL 230 illustrated in FIG. 2.

The latency circuit 120 includes a command decoder & latency control unit 121, a first delay line 123, and a latency sub unit 125.

A first delay line 211, a DLL sub unit 213, a clock tree and an output driver replica 215, a clock buffer replica 217, a phase detector 218, and control logic 219 are included in the first DLL 210.

A second delay line 231, a clock tree and an output driver replica 235, a clock buffer replica 237, a phase detector 238, and control logic 239 are included in the second DLL 230.

The quantity of delay of the first and second delay lines 211 and 231 may be different from each other. A loop 1 AR1 of the first DLL 210 is provided for a read latency control. A loop 2 AR2 of the second DLL 230 is provided for generation of a data output enable signal EN and a data output strobe signal DQS.

The second region R20 includes the first output circuit 300 and the second output circuit 400. The first output circuit 300 includes a flip flop 310, a clock tree replica 320, a read FIFO 330, and an output driver 340. The second output circuit 400 includes a clock tree 410 and an output driver 420 for an output of DQS.

In this embodiment, the clock tree replica 320 may be configured to be equal to the quantity of delay of the clock tree 410. The clock buffer replica 217 may be configured to be equal to the quantity of delay of a clock buffer 202.

The clock tree & output driver replica 215 may be configured to be equal to the sum of the quantity of delay of the clock tree 410 and the quantity of delay of the output driver 340.

The clock buffer replica 237 may be configured to be equal to the quantity of delay of the clock buffer 202.

The clock tree & output driver replica 235 may be configured to be equal to the sum of the quantity of delay of the clock tree 410 and the quantity of delay of the output driver 420.

The first delay line 123 may be configured to be equal to the first delay line 211, and may be disabled to reduce power consumption during reading of data.

A clock applied to the second delay line 231 of the second DLL 230 may be a clock output from the clock buffer 202. Alternatively, the clock applied the second delay line 231 of the second DLL 230 may be a second input clock that is phase-splitted through a phase splitter 250 which may be selectively provided.

Since the second DLL 230 has internal circuits which swing to the current mode logic (CML) level, the second DLL 230 may have good jitter performance but may consume a relatively large amount of power. Since the first DLL 210 has internal circuits which swing to the CMOS level, the first DLL 210 may have inferior jitter performance but may consume a relatively small amount of power.

In the case where the amplitude of a clock swing is great, power noise may be relatively large. As a result, the jitter characteristic may be bad.

A read latency path formed by the latency circuit 120 copies the first delay line 211 of the first DLL 210. Thus, if the first DLL 210 which consumes a relatively small amount of power is used to control latency, the power being consumed in the read latency path can be further reduced.

The flip flop 310 latches an enable pre-signal EN_PRE based on the second clock CLK__2 to generate a data output enable signal EN. A clock being applied to the flip flop 310 is not the first clock CLK__1, but the second clock CLK__2 to which a clock domain is changed. If a domain change is performed by a clock having a relatively superior jitter characteristic, although the enable pre-signal EN_PRE for latency control in the first region R10 has jitter caused by power noise, a jitter-free latency control signal (that is, the data output enable signal EN) may be output after an output stage of the flip flop 310.

The clock domain change scheme can be applied to a DDR4 3.2 GT/s of SDRAM. An operation range of SDRAM required in a newly introduced DDR4 is from 1.6 GT/s to 3.3 GT/s and an operation voltage is 1.2V or less. Since the circuit including two different operation types of DLLs has an improved DLL jitter characteristic and a small amount of power consumption, it can be suitably applied to a DDR4 of SDRAM.

Figure 4:
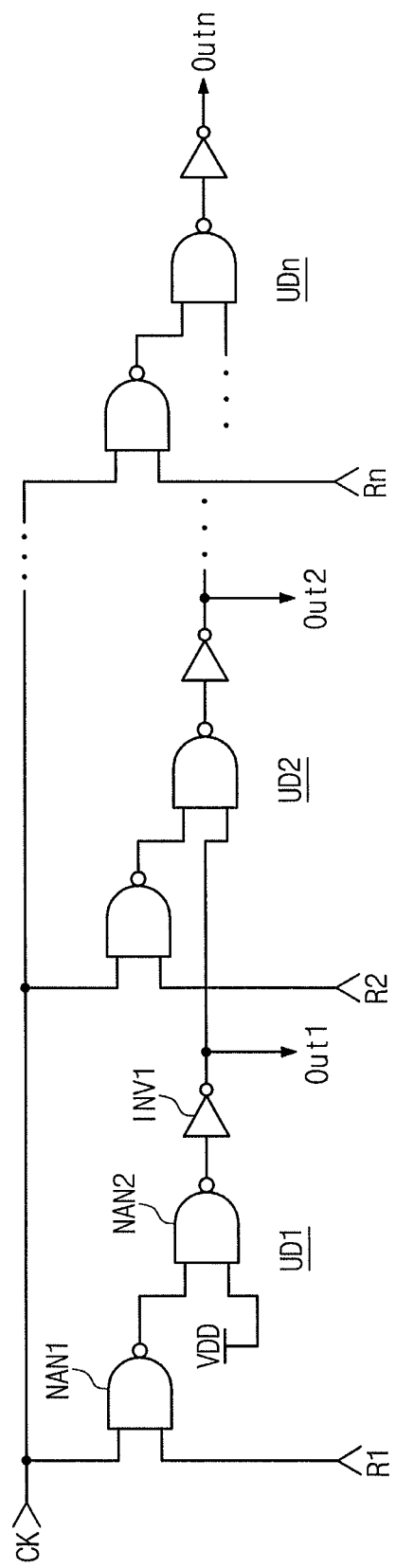
FIG. 4 illustrates an example of a delay line in FIG. 3.

FIG. 4 illustrates an example of one type of delay line that can be applied to FIG. 3. Referring to FIG. 4, the delay line may include one or more unit delays. In one embodiment, the delay line may include a plurality of unit delays UD1~UDn. One delay line UD can be formed, for example, by two NAND gates NAN1 and NAN2 and an inverter INV1.

A clock is commonly applied to one input of each NAND gate NAN1. Control signals R1~Rn are applied to the respective other inputs of the NAND gates NAN1. That is, a control signal R1 is applied to the other input of the NAND gate NAN1 constituting the first unit delay UD1. The control signal R1 may be provided from the control logics 219 and 239 illustrated in FIG. 3. The delay line of FIG. 4 can be applied to implement the first and second delay lines 211 and 231 of FIG. 3. In other embodiments, the first and second delay lines 211 and 231 of FIG. 3 can be implemented with not only an inverter delay but also different types of delays or delay circuits.

Figure 5:
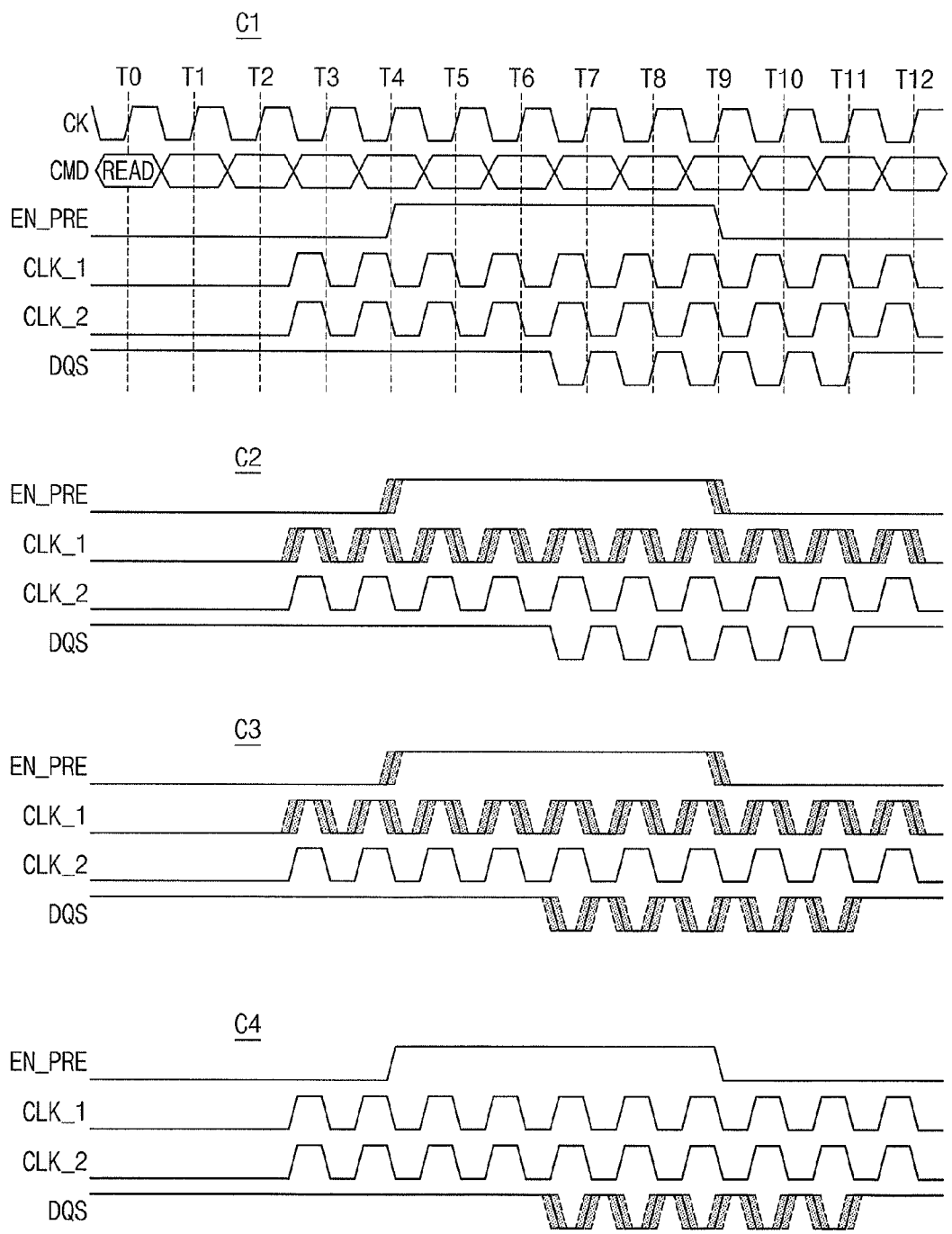
FIG. 5 illustrates an embodiment of a timing diagram for the control circuit.

FIG. 5 illustrates one embodiment of a timing diagram for the control circuit of FIG. 3. More specifically, FIG. 5 represents a read timing diagram for the exemplary case of DDR4. In the case that a read latency RL is 7, a data output strobe signal DQS is generated in synchronization with a seventh rising edge of an input clock CK after a read command is applied.

In case 1 (C1) of FIG. 5, jitter-free waveform signals EN_PRE, CLK__1, CLK__2, and DQS are ideally generated because an effect caused by a power noise does not exist. However, actually, waveform signals EN_PRE and CLK__1 having jitter, which, for example, may resemble the jitter shown in case 2 (C2). In case 2 (C2), a jitter effect caused by power noise in the first region R10 of FIG. 3 exists. As illustrated in the case 2 (C2), although the waveform signals EN_PRE and CLK__1 having jitter are generated, the second DLL 230 generates a jitter-free or jitter-reduced second clock CLK__2. Thus, a waveform signal DQS output through the second output circuit 400 is generated as a jitter-free or jitter-reduced signal.

In case 3 (C3), a jitter effect caused by power noise in the first and second regions R10 and R20 exists. As illustrated in the case 3 (C3), although waveform signals EN_PRE and CLK__1 having jitter are generated, the second DLL 230 generates a jitter-free or jitter-reduced second clock CLK__2. In this case, a waveform signal DQS output through the second output circuit 400 is affected by jitter, but is generated as a jitter-reduced signal as compared with a case of using a single DLL.

In case 4 (C4), a jitter effect caused by power noise in the second region R20 of FIG. 3 exists. As illustrated in the case 4 (C4), jitter-free waveform signals EN_PRE, CLK__1, and CLK__2 may be generated. Similarly, in this case, a waveform signal DQS output through the second output circuit 400 is affected by jitter, but is generated as a jitter-reduced signal as compared with a case of using a single DLL.

As illustrated through FIG. 5, even if an enable pre-signal EN_PRE has a jitter from power noise in the first region R10, the amount of jitter shown in a final output is reduced by a jitter-free or jitter-reduced second clock waveform CLK__2.

Figure 6:
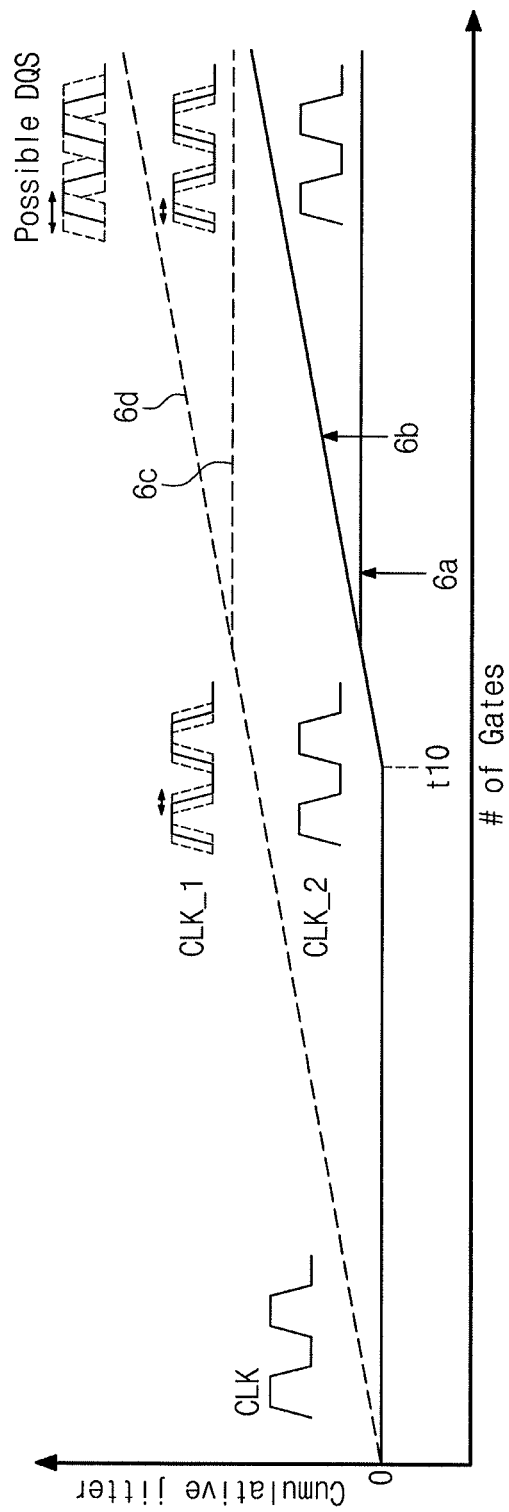
FIG. 6 illustrates an example of how a jitter characteristic of the control circuit may have improved performance.

FIG. 6 illustrates one way in which an improvement of a jitter characteristic may be realized by one or more of the aforementioned embodiments of the control circuit, such as, for example, the control circuit of FIG. 3. In FIG. 6, the horizontal axis represents the number of gates and the vertical axis represents the amount of accumulated jitter. In one embodiment, the gates may correspond to delays existing in a DLL.

Point t10 indicates an input point of a clock stage of the flip flop 310 in FIG. 3. In the case of a dual DLL, even if the number of the gates increases, the amount of accumulated jitter is relatively small compared with a single DLL case. The amount 6a of accumulated jitter is less than the amount 6c of accumulated jitter, and the amount 6b of accumulated jitter1 is less than the amount 6d of accumulated jitter.

More specifically, 6a represents a jitter graph at a time when power noise exists in the first region R10 of FIG. 3. Also, 6c represents a jitter graph at a time when a single DLL is applied and a power noise exists in the first region R10 of FIG. 3. Also, 6b represents a jitter graph at a time when power noise exists in the first and second regions R10 and R20 of FIG. 3. Also, 6d represents a jitter graph at a time when a single DLL is applied and power noise exists in the first and second regions R10 and R20 of FIG. 3.

According to a circuit scheme of FIG. 3 using different types of DLLs and performing a change of a clock domain, even if the number of gates increases, a jitter characteristic is superior as compared with the case of a single DLL. Also, a single DLL is vulnerable to power noise. Consequently, the amount of accumulated jitter increases as the number of gates increases.

Thus, it is difficult to satisfy a jitter spec required for a single DLL. An internal margin of a latency control is insufficient at high frequency. In the case of controlling latency by dead copying a DLL, because of an insufficient of an internal margin, it is difficult to unlimitedly use DLL power to obtain a certain level of performance. If DLL power is increased to satisfy performance, latency control power is also increased. As a result, DLL design is limited.

On the other hand, the control circuit of the embodiments described herein use different types of DLLs. As a result, power noise generated from the first region R10 is clearly filtered. Also, jitter is relatively minimized or reduced in output signals finally obtained by a clock domain change.

Figure 7:
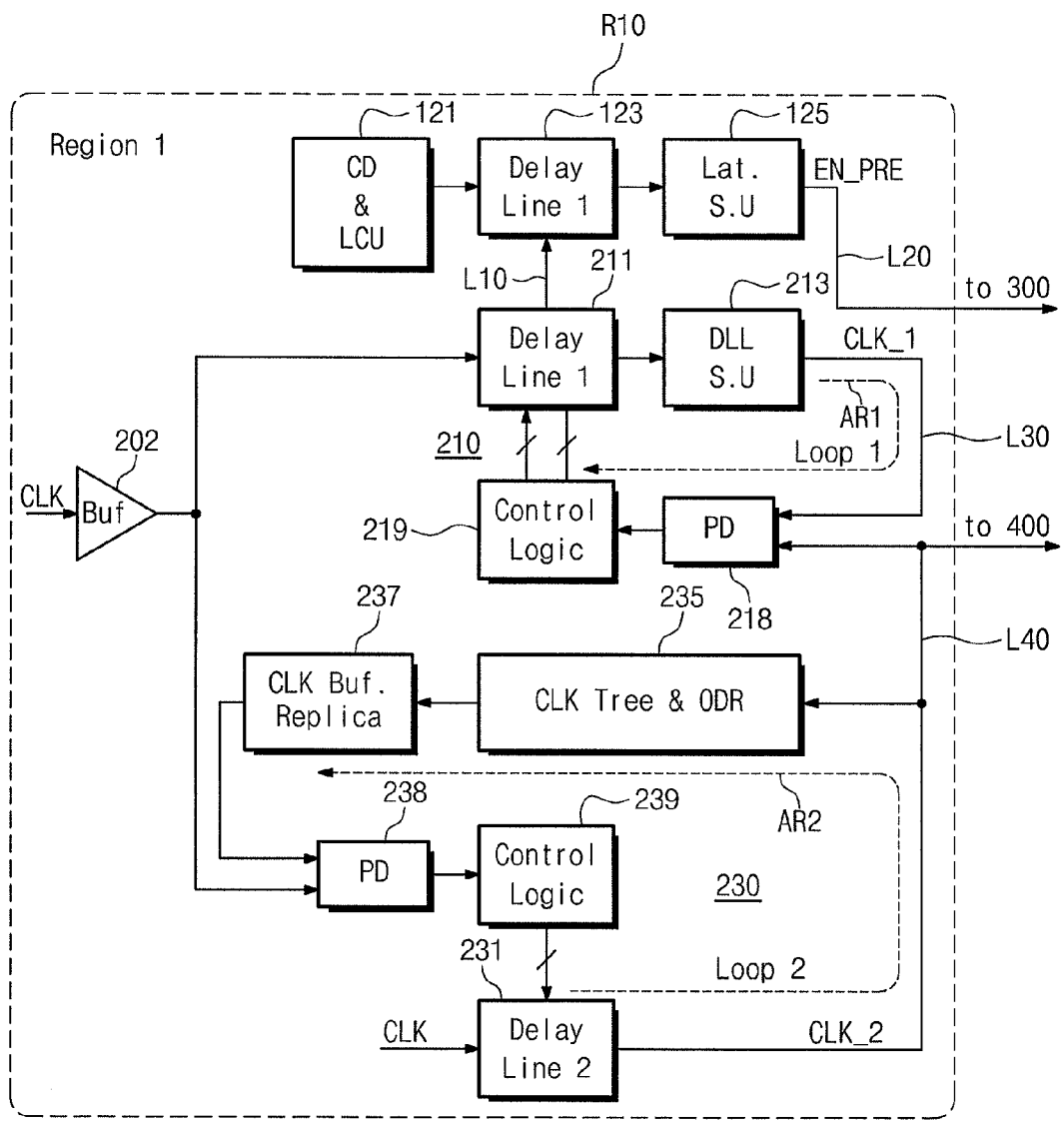
FIG. 7 illustrates another embodiment of the control circuit in FIG. 2.

FIG. 7 illustrates embodiment of the control circuit of FIG. 2. Referring to FIG. 7, this control circuit includes a command decoder & latency control unit 121, a first delay line 123, and a latency sub unit 125 included in the latency circuit 120.

A first delay line 211, a DLL sub unit 213, a phase detector 218, and control logic 219 is included in the first DLL 210. Unlike FIG. 3, the phase detector 218 detects a phase difference between a phase of a first clock CLK__1 and a phase of a second clock CLK__2. A locking operation of the first clock CLK__1 is performed after the second clock CLK__2 is locked. The first delay line 211 is controlled by the control logic 219 outputting a delay line control signal according to a detection output of the phase detector 218.

A second delay line 231, a clock tree and an output driver replica 235, a clock buffer replica 237, a phase detector 238, and control logic 239 is included in the second DLL 230 of FIG. 2.

In FIG. 7, first DLL 210 may have the same structure as first DLL 210 without the clock tree & output driver replica 215 and the clock buffer replica 217. Also, the amount of delays in the first delay line 211 may be different from the amount of delays in the second delay line 231.

The first DLL 210 is prepared to control a read latency and the second DLL 230 is prepared to participate in generation of a data output enable signal EN and a data output strobe signal DQS. The first delay line 123 may be configured to be equal to the first delay line 211. Also, the first delay line 123 may be disabled to reduce power consumption during an operation in which data is read.

A clock applied to the second delay line 231 of the second DLL 230 may be a clock output from the clock buffer 202. Alternatively, a clock applied to the second delay line 231 of the second DLL 230 may be a second input clock that is phase-splitted through the phase splitter 250 illustrated in FIG. 3.

Since the second DLL 230 has internal circuits which swing to the current mode logic (CML) level, the second DLL 230 has good jitter performance but consumes a relatively large amount of power. Since the first DLL 210 has internal circuits which swing to the CMOS level, the first DLL 210 has inferior jitter performance but consumes a relatively small amount of power.

A read latency path formed by the latency circuit 120 copies the first delay line 211 of the first DLL 210. Thus, if the first DLL 210 which consumes a relatively small amount of power is used to control latency, the power consumed in the read latency path can be further reduced.

The second DLL 230 can be embodied by a CML circuit. The CML circuit has a small swing level. Since the CML circuit has a differential circuit structure, its noise immunity is strong. Also, since the CML circuit does not generate a dynamic current component, it reduces or minimizes noise generation in peripheral circuits.

Although a locking time of the circuit of FIG. 7 is longer than that of the circuit of FIG. 3, an additional hardware burden is relatively reduced since a circuit structure is relatively simple as compared with that of FIG. 3.

Figure 8:
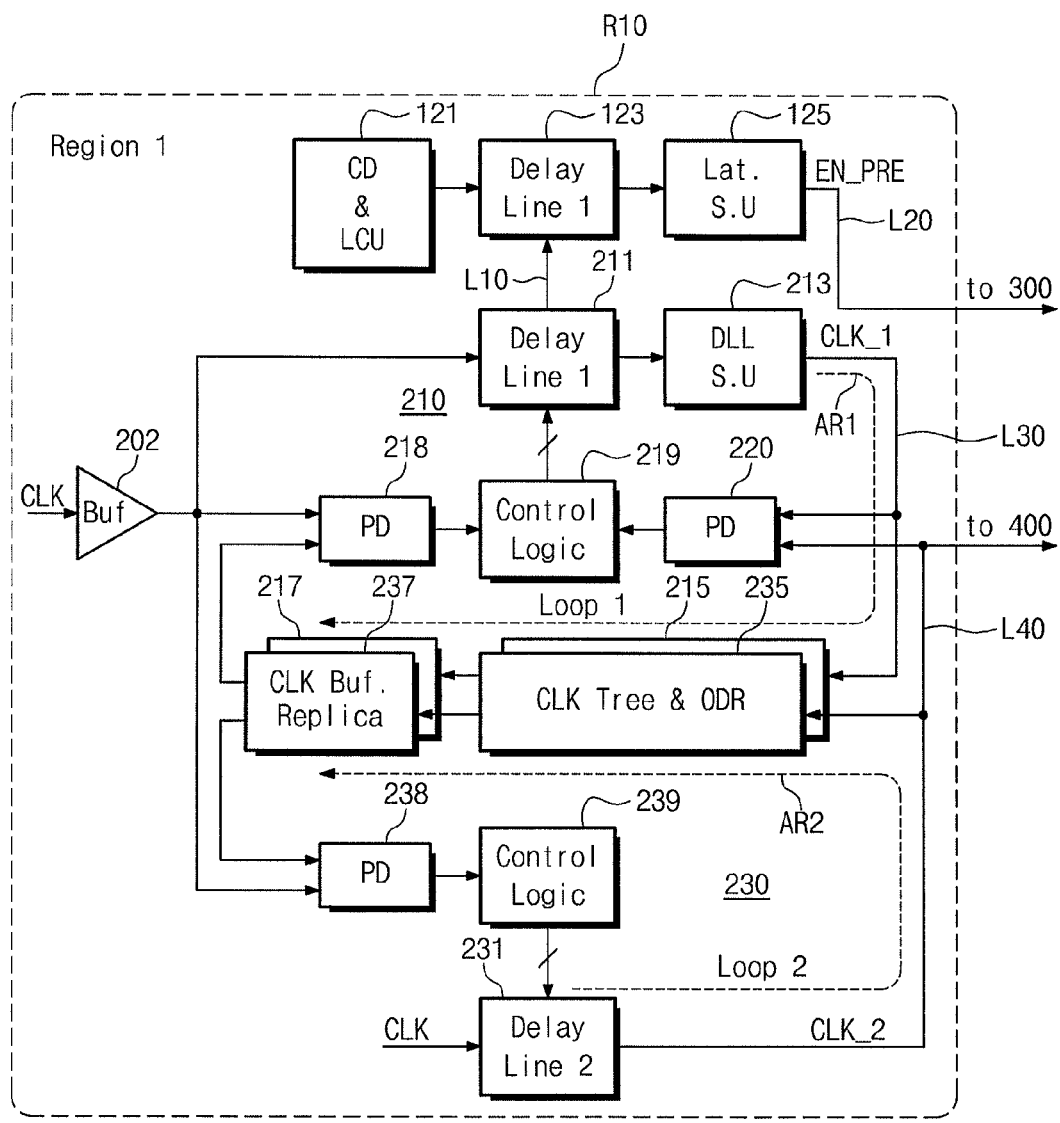
FIG. 8 illustrates another embodiment of the control circuit in FIG. 2.

FIG. 8 illustrates another embodiment of the control circuit of FIG. 2. A circuit structure of FIG. 8 may be the same as FIG. 3, except for an additionally connected phase detector 220 in FIG. 8.

The phase detector 220 detects a phase difference between a phase of the first clock CLK__1 and a phase of the second clock CLK__2. A locking operation of the first clock CLK__1 is performed along a first loop AR1 independently from a locking operation of the second clock CLK__2. The locking operation of the second clock CLK__2 is performed along a second loop AR2 independently from the locking operation of the first clock CLK__1.

As a result, the first delay line 211 is controlled by the control logic 219 outputting a delay line control signal according to a detection output of the phase detector 218 or a detection output of the phase detector 220. The control logic 219 can select one of the detection output of the phase detector 218 or the detection output of the phase detector 220 depending on an operation condition or a locking state which is set.

The circuit of FIG. 8 further includes the phase detector as compared with the circuit of FIG. 3, but has relatively high operation reliability.

Figure 9:
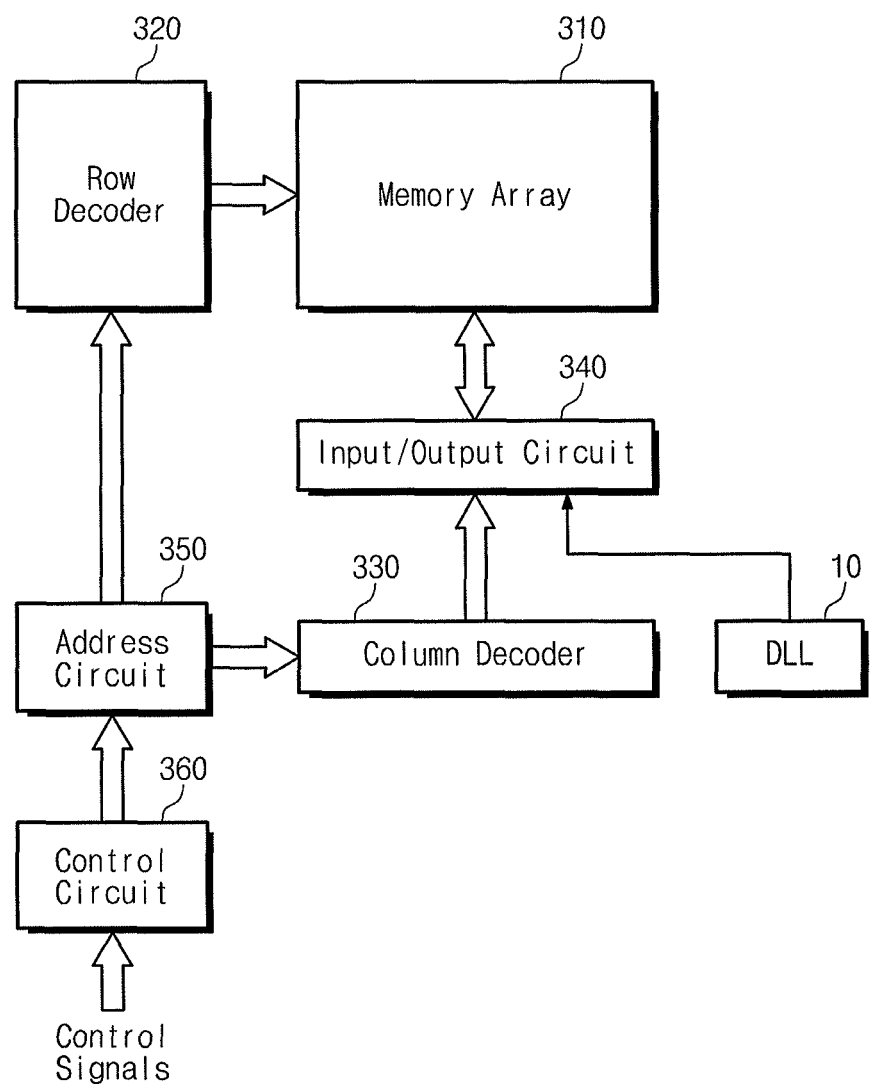
FIG. 9 illustrates an embodiment of a semiconductor memory device including a delay locked loop circuit in accordance with FIG. 2.

FIG. 9 illustrates an embodiment of a semiconductor memory device 300 including a delay locked loop circuit in accordance with FIG. 2. Referring to FIG. 9, semiconductor memory device 300 includes a DLL 10, a memory array 310, a row decoder 320, a column decoder 330, an input/output circuit 340, an address circuit 350, and a control circuit 360.

The memory array 310 may include a plurality of word lines, a plurality of bit lines, and a plurality of memory cells connected between the word lines and the bit lines. Each of the memory cells can be embodied by a volatile memory cell such as a DRAM or a SRAM.

Each of the memory cells can be embodied by a nonvolatile memory cell. A nonvolatile memory device including the nonvolatile memory cells may be an electrically erasable programmable read-only memory (EEPROM), a flash memory, a magnetic random access memory (MRAM), a spin-transfer torque MRAM, a conductive bridging RAM (CBRAM), a ferroelectric RAM (FeRAM), a phase change RAM (PRAM) which is called an ovonic unified memory (OUM), a resistive RAM (RRAM), a nanotube RRAM, a polymer RAM (PoRAM), a nanotube floating gate memory (NFGM), a holographic memory, a molecular electronics memory device, or an insulator resistance change memory.

Each of the nonvolatile memory cells can store one bit or multiple bits.

The row decoder 320 receives a row address applied from the address circuit 350 to decode the received row address. At least one word line among the plurality of word lines is selected by a decoding operation of the row decoder 320.

The column decoder 330 receives a column address applied from the address circuit 350 to decode the received column address. At least one bit line among the plurality of bit lines is selected by a decoding operation of the column decoder 330.

The input/output circuit 340 can write data in a memory cell selected by the row decoder 320 and the column decoder 330. The input/output circuit 340 can read data from a memory cell selected by the row decoder 320 and the column decoder 330.

The input/output circuit 340 may include sense amplifiers to sense and amplify data to be read when a read operation is performed and drivers to drive data to be written when a write operation is performed.

The address circuit 350 can receive an input address under the control of the control circuit 360 to output a row address and a column address.

The control circuit 360 can generate a plurality of operation control signals that can control an operation of the address circuit 350 in response to a plurality of control signals used to perform a read or write operation. As described through FIG. 3, the control circuit 360 can control the DLL 10. In this case, the DLL 10 is a circuit including two different operation types of DLLs.

Thus, since the DLL 10 having an improved jitter characteristic and consuming a small amount of power is provided, the semiconductor memory device 300 can properly operate according to the operation specification of SDRAM DDR4.

The input/output circuit 340 can perform a read latency operation in synchronization with clocks output from the DLL 10. In this case, since a jitter-free characteristic and low-power consumption are realized, operation performance of the semiconductor memory device 300 is improved.

The semiconductor memory device 300 can suitably perform an on-die termination (ODT) operation based on the clocks output from the DLL 10. The ODT technology may improve signal integrity by reducing or minimizing signal reflection at an interface between a system and a memory based on stub series termination logic (SSTL). Using ODT technology, in a SDRAM of DDR2 specification or more, a DRAM and a memory controller can provide a termination voltage.

Figure 10:
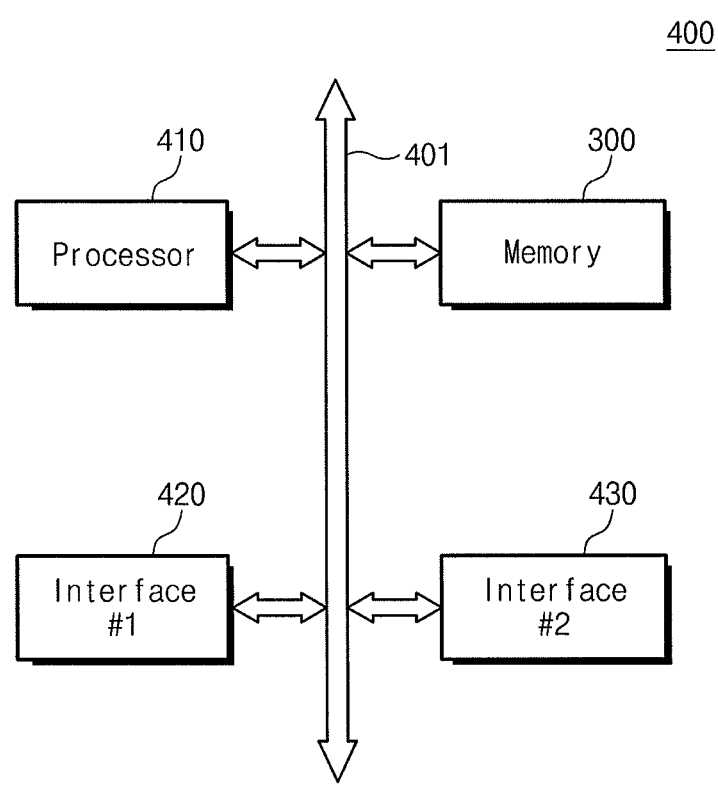
FIG. 10 illustrates an embodiment of a semiconductor system including the semiconductor memory device of FIG. 9.

FIG. 10 illustrates an embodiment of a semiconductor system 400 which includes the semiconductor memory device of FIG. 9. Semiconductor system 400 can be applied to, for example, a PC, a tablet, a portable computer, a portable mobile communication device, or consumer equipment (CE). The mobile communication device may include, for example, a mobile telephone, a PDA or a PMP.

Also, the semiconductor system 400 may be, for example, a memory card, an e-book, a game machine, a game controller, a navigator, or an electronic instrument. The consumer equipment (CE) may be, for example, a digital TV, a home automation device or a digital camera.

In this embodiment, the semiconductor system 400 includes memory 300 and processor 410 corresponding to the semiconductor memory device of FIG. 9. Thus, the memory 300 and the processor 410 can exchange data through a bus 401. The processor 410 can control the whole memory access operation of the memory 300.

The semiconductor system 400 can further include an interface module 420. The interface module 420 may be a wireless communication module. Thus, the interface module 420 can transmit data stored in the memory 300 to an external device through, for example, wireless communication under the control of the processor 410 and can store data received from an external device in the memory 300.

The interface module 420 may be an image sensor. The image sensor can store a digital signal generated by picking up an image in the memory 300 under the control of the processor 410 and can transmit data stored in the memory 300 to an external device through an input/output interface 430.

The semiconductor system 400 can further include the input/output interface 430. The input/output interface 430 may be a display device. The input/output interface 430 may be an input device such as a keyboard, a mouse, a scanner, or an output device such as a printer.

In the case of FIG. 10, since the memory 300 and the processor 410 can include the dual DLLs illustrated in FIG. 2, the semiconductor system 400 has an improved jitter characteristic and consumes a small amount of power.

Figure 11:
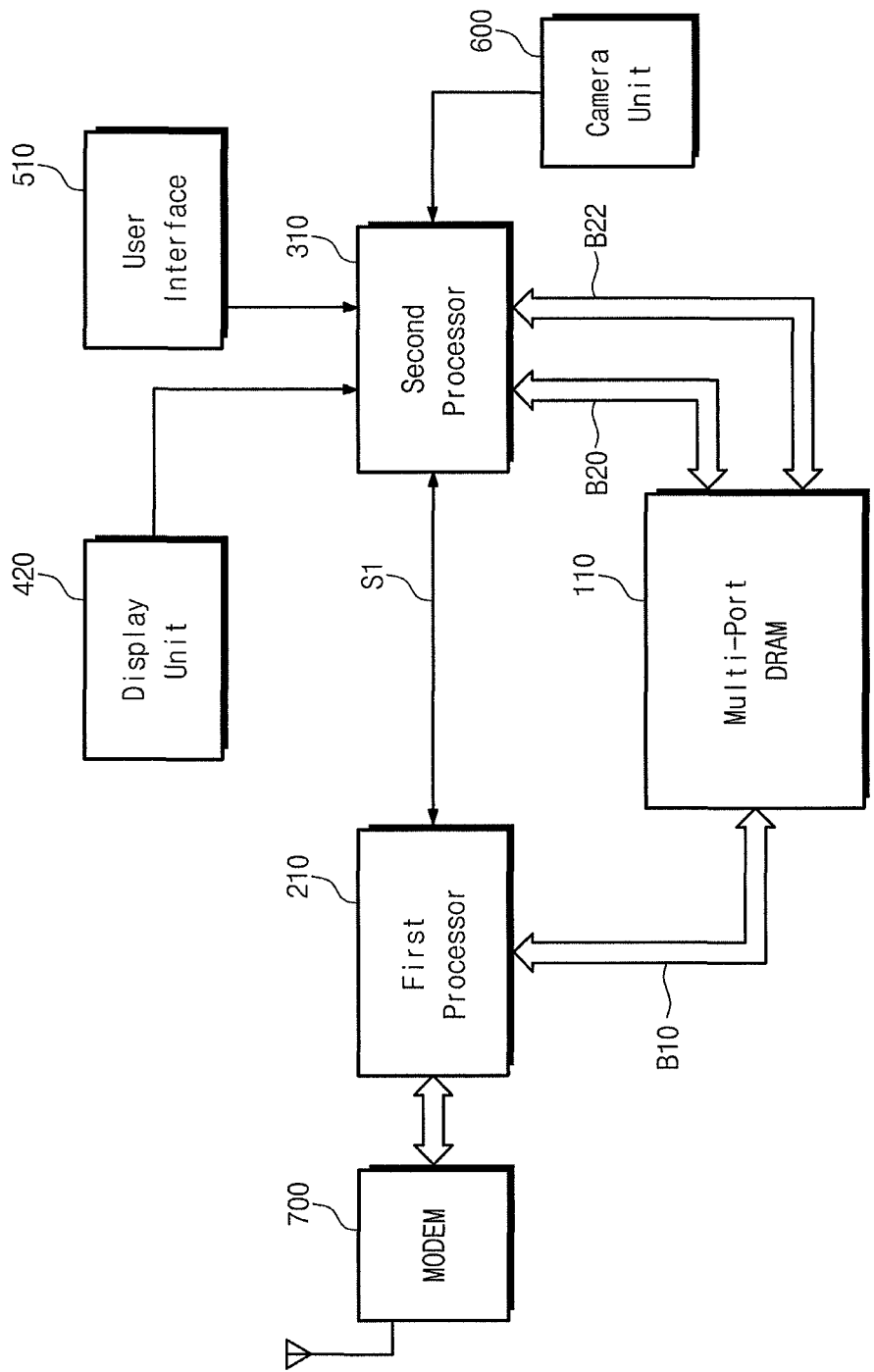
FIG. 11 illustrates an example application of one or more of the aforementioned embodiments in a mobile device.

FIG. 11 illustrates an application example for a mobile device. Referring to FIG. 11, the mobile device (e.g., a smart phone) may include a multi-port DRAM 110, a first processor 210, a second processor 310, a display unit 420, a user interface 510, a camera unit 600, and a Modem 700.

The multi-port DRAM 110 has three ports connected to first, second and third buses B10, B20, and B22 and is connected to the first processor 210 and the second processor 310. A first port of the multi-port DRAM 110 is connected to the first processor 210 (which, for example, may be a baseband processor) through the first bus B10 and is connected to the second processor 310 (which, for example, may be an application processor) through the second bus B20.

A third port of the multi-port DRAM 110 is connected to the second processor 310 through the third bus B22. Thus, one multi-port DRAM 110 can replace one storage memory and two DRAMs. The multi-port DRAM 110 can be embodied by the semiconductor memory device illustrated in FIG. 8.

The multi-port DRAM 110 of FIG. 11 includes three ports and can perform a function of both a DRAM and a flash memory. In that case, since the multi-port DRAM 110 can operate as a DRAM interface, it can replace two DRAMs.

In one embodiment, the multi-port DRAM 110 may have an operation range and an operation voltage required in a SDRAM DDR4.

The multi-port DRAM 110 can operate different types of DLLs as follows. The multi-port DRAM 110 can generate a first clock delay-synchronized with a first input clock as a signal for a data output timing control using a first delay locked loop circuit having a first delay line. The multi-port DRAM 110 can generate a second clock delay-synchronized with a second input clock using a second delay locked loop circuit having a second delay line and a relatively superior jitter characteristic as compared with the first delay locked loop circuit. Also, the multi-port DRAM 110 can generate a data output enable signal to change a clock domain using the second clock.

An interface of the first bus B10 may be a volatile memory interface and the first port receives a first packet data (DQ1/ADDR1/CMD1) generated from the first processor 210 to transmit the received first packet data to an internal circuit block of the multi-port DRAM 110. The first port provides first data of the multi-port DRAM 110 to the first processor 210. In this case, the first data may be parallel data.

An interface of the third bus B22 may also be a volatile memory interface. The third port may receive a third packet data (DQ3/ADDR3/CMD3) generated from the second processor 310 and transmit the received third packet data to an internal circuit block of the multi-port DRAM 110. The third port provides third data of the multi-port DRAM 110 to the second processor 310.

An interface of the second bus B20 may be a nonvolatile memory interface such as a NAND flash. The second port may receive a second packet data (DQ2/ADDR2/CMD2) generated from the second processor 310 and transmit the received second packet data to an internal circuit block of the multi-port DRAM 110. The second port provides second data of the multi-port DRAM 110 to the second processor 310. In this case, the second data may be parallel or serial data.

An interface of the buses may be one of various interface protocols such as a universal serial bus (USB), a multimedia card (MMC), a peripheral component interconnect-express (PCIE), a serial attached SCSI (SAS), a serial advanced technology attachment (SATA), a parallel advanced technology attachment (PATA), a small computer system interface (SCSI), an enhanced small disk interface (ESDI), or an integrated drive electronics (IDE).

The first and second processors 210 and 310 and the multi-port DRAM 110 can be manufactured or packaged in one chip or on different chips. The multi-port DRAM 110 can be embedded in the mobile device. In the case that the mobile device is a portable communication device, the Modem 700 may perform functions of transmission and reception of communication data, may modulate and demodulate data, and may be connected to the first processor 210.

A NOR- or NAND-type flash memory may be connected to the first or second processor 210 or 310 to store large amounts of information.

The display unit 420 may be a device such as a liquid crystal device having a backlight, a liquid crystal device having a LED light source or an OLED and may have a touch screen. The display unit 420 functions as an output device displaying an image such as character, number, picture, etc., by color.

As indicated, the mobile device may be mobile communication device. Alternatively, the mobile device may be used as a smart card by adding or subtracting constituent elements.

The mobile device can connect a separate interface to an external communication device. The communication device may be, for example, a digital versatile disc (DVD) player, a computer, a set top box, a game machine, a digital camcorder, etc.

The camera unit 600 may include a camera image processor (CIS) connected to the second processor 310. The mobile device may further include an application chipset, or a mobile DRAM.

A chip of the multi-port DRAM 110 or a chip of the processor can be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), or wafer-level processed stack package (WSP).

Although a DRAM is installed as an illustration in FIG. 11, various types of volatile or nonvolatile memories may be used. The memories can store various types of data information such as a text, a graphic, a software code, etc.

According to some exemplary embodiments, a delay locked loop circuit which has superior jitter characteristic and which consumes a small amount of power is provided. In the case that the delay locked loop circuit is applied to a synchronous semiconductor memory device, the synchronous semiconductor memory device has improved operation reliability and consumes a small amount of power.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A synchronous semiconductor memory device, comprising:
 a first delay locked loop circuit having a first delay line, the first delay locked loop circuit to generate a first clock delay-synchronized with a clock applied as a signal for a data output timing control; and
 a second delay locked loop circuit having a second delay line, the second delay locked loop circuit to generate a second clock delay-synchronized with the clock, wherein the first delay locked loop circuit consumes less power than the second delay locked loop circuit, and wherein the second delay locked loop circuit has less jitter than the first delay locked loop circuit.

2. The device as claimed in claim 1, wherein the first and second delay locked loop circuits operate at different logic levels for a delay synchronization operation.

3. The device as claimed in claim 1, wherein the first clock is to control read latency.

4. The device as claimed in claim 1, wherein the second clock is to generate a data output strobe signal.

5. The device as claimed in claim 1, wherein the second delay locked loop circuit swings the clock to current mode logic (CML) level.

6. The device as claimed in claim 1, wherein the first delay line and the second delay line have different amounts of delay.

7. The device as claimed in claim 1, wherein an amount jitter in the output signal of at least one of the first or second delay locked loop circuits is affected by power noise.

8. The device as claimed in claim 1, wherein the synchronous semiconductor memory device is a SDRAM.

9. The device as claimed in claim 8, wherein the SDRAM has an operation range and an operation voltage that corresponds to DDR4.

10. The device as claimed in claim 1, wherein the first delay locked loop circuit swing the clock to a CMOS level.

11. A method of operating a delay locked loop circuit of a synchronous semiconductor memory device, the method comprising:
- generating a first clock delay-synchronized with a first input clock, the first clock generated by a first delay locked loop circuit having a first delay line;
- controlling data output timing control based on the first clock;
- generating a second clock delay-synchronized with a second input clock, the second clock generated by a second delay locked loop circuit having a second delay line; and
- generating a data output enable signal based on the second clock, wherein the second delay locked loop circuit has less jitter than the first delay locked loop circuit and wherein the data output enable signal is applied to change a clock domain.

12. The method as claimed in claim 11, wherein the first and second delay locked loop circuits operate at different logic levels for a delay synchronization operation.

13. The method as claimed in claim 11, wherein the first input clock is phase-splitted.

14. The method as claimed in claim 11, wherein the second input clock has substantially a same phase as the first input clock.

15. The method as claimed in claim 11, wherein the second input clock has a phase different from a phase of the first input clock.

16. The method as claimed in claim 11, wherein the first delay locked loop circuit consumes less power than the second delay locked loop circuit.

17. The method as claimed in claim 11, further comprising:
- controlling read latency based on the first clock; and
- generating a data output strobe signal based on the second clock.

18. A control circuit, comprising:
- a first delay locked loop circuit to swing a clock signal to current mode logic level to generate a first clock delay-synchronized with the clock signal; and
- a second delay locked loop circuit to swing the clock signal to a CMOS logic level to generate a second clock delay-synchronized with the clock signal, wherein the first delay locked loop circuit consumes less power than the second delay locked loop circuit, and wherein the second delay locked loop circuit has less jitter than the first delay locked loop circuit.

19. The control circuit as claimed in claim 18, wherein the first and second delay locked loop circuits produce different amounts of delay.

20. The control circuit as claimed in claim 18, wherein:
- the first clock is to control read latency; and
- the second clock is to generate a data output strobe signal.

* * * * *